United States Patent  [10] Patent No.: US 8,339,174 B2
Yang et al.  [45] Date of Patent: Dec. 25, 2012

(54) APPARATUS, CIRCUIT AND METHOD FOR AUTOMATIC PHASE-SHIFTING PULSE WIDTH MODULATED SIGNAL GENERATION

(75) Inventors: Zhiyu Yang, Cupertino, CA (US); Dilip S, Saratoga, CA (US); Tushar Dhayagude, Santa Clara, CA (US)

(73) Assignee: Atmel Corporation, San Jose, CA (US)

( * ) Notice: Subject to any disclaimer, the term of this patent is extended or adjusted under 35 U.S.C. 154(b) by 427 days.

(21) Appl. No.: 12/712,930

(22) Filed: Feb. 25, 2010

(65) Prior Publication Data

US 2011/0204810 A1     Aug. 25, 2011

(51) Int. Cl.
*H03K 3/00*     (2006.01)
(52) U.S. Cl. .................. 327/239; 327/237; 327/242
(58) Field of Classification Search .................. None
See application file for complete search history.

(56) References Cited

U.S. PATENT DOCUMENTS 7,847,491 B2 * 12/2010 Lin et al. ................. 315/307
7,944,263 B2 *  5/2011 Suda ....................... 327/269

OTHER PUBLICATIONS

Erickson, et al. Fundamentals of Power Electronics, Second edition. Last accessed Apr. 22, 2010, 36 pages.
Doshi, et al. Digital Architecture for Driving Large LED Arrays with Dynamic Bus Voltage Regulation and Phase Shifted PWM. Last accessed Apr. 21, 2010, 7 pages.

* cited by examiner

*Primary Examiner* — An Luu
(74) *Attorney, Agent, or Firm* — Fish & Richardson P.C.

(57) ABSTRACT

Systems, circuits and methods for phase-shifting pulse width modulated signal generation are disclosed. In some embodiments, a phase-shifting pulse width modulation circuit is configured to output pulses based on an input pulse width modulated signal. The pulses are staggered relative to one another, and can be received by a light-emitting diode driver for driving a light-emitting diode string at one or more time periods. The phase-shifting pulse width modulation circuit can include a counter-based programmable delay subcircuit consisting of two counter-based programmable delay blocks.

20 Claims, 8 Drawing Sheets

APPARATUS, CIRCUIT AND METHOD FOR AUTOMATIC PHASE-SHIFTING PULSE WIDTH MODULATED SIGNAL GENERATION

BACKGROUND

I. Field

The following description relates to pulse width modulated signal generation, in general, and phase-shifting pulse width modulated signal generation, in particular.

II. Background

The proliferation of light emitting diode (LED) backlighting applications has increased significantly with the onslaught of consumer portable devices such as cell phones and personal digital assistants. Phase-shifting pulse width modulation (PSPWM) power management integrated circuits can be employed to control an array of LEDs used for the backlighting applications. In conventional systems, a PSPWM circuit drives multiple strings of LEDs such that each LED string in an LED array turns on at different phases while maintaining the same duty cycle. As such, the electromagnetic interference is reduced relative to the electromagnetic interference that would result if the LED strings in the LED array are all turned on and off at the same time. Further, the power required to be provided to the LED array is reduced by turning the LED strings on at different phases, relative to the power required to be provided to the LED array if each of the LED strings was turned on at the same time. These conventional circuits typically and disadvantageously employ the two architectures discussed below in this section.

First, and as shown in FIG. 1, the circuit can include a PSPWM generator 110 configured to receive a pulse width-modulated signal 120 and output a plurality of LED driver signals 130a, 130b, ..., 130x configured to drive LED strings (not shown) of an LED array. In some embodiments, LED driver signals 130a, 130b, ..., 130x can be n LED driver signals. The PSPWM generator 110 can include a period measurement block 140 for measuring the period of the signal 120 and a plurality of programmable delay blocks 150b, ..., 150x coupled to one another in series. In some embodiments, programmable delay blocks 150b, ..., 150x can be n–1 programmable delay blocks. The PSPWM generator 110 can receive the signal 120 and the period measurement block 140 can determine the period of the signal, T. The period measurement block 140 outputs information indicative of the period to programmable delay blocks 150b, ..., 150x. The programmable delay blocks 150b, ..., 150x can output LED driver signals 130b, ..., 130x. In some embodiments, the output LED driver signals 130b, ..., 130x can be n–1 output LED driver signals. The PSPWM generator 110 also outputs output LED driver signal 130a, as shown in FIG. 1. For embodiments wherein there are n LED strings, and n LED drivers, the n LED driver signals 130a, 130b, ..., 130x output from the PSWPM generator 110 can have a period T. The programmable delay blocks 150b, ..., 150x can provide a staggered, delayed output of the LED driver signals 130b, ..., 130x such that the pulses of the LED driver signals 130b, ..., 130x are equally spaced relative to one another, and relative to LED driver signal 130a, as shown in FIG. 1. In some embodiments, the LED driver signals 130a, 130b, ..., 130x are overlapping and, in other embodiments, non-overlapping. Unfortunately, this circuit disadvantageously requires a significant amount of memory and power because a programmable delay block (and corresponding power) is required for each of LED string in the LED array.

Second, the above-referenced circuit can utilize a counter-based architecture (not shown) that has two counters for each LED string for which power is to be provided. In the counter-based architecture, two counters can be substituted for each programmable delay block. The two counters identify the rising edge of the input signal, and a falling edge of the input signal, respectively. However, as with the circuit shown in FIG. 1, circuits employing counter-based approaches require a significant amount of power because at least two counters are required for each LED string in the LED array. Accordingly, circuits and methods resulting in lower power consumption and/or complexity than the convention approaches are desired. Further, due to the unique ability for hardware circuits to accurately implement the staggered, delayed aspect of the LED driver signals, all hardware circuits for automatic PSPWM signal generation are desired.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

Low-power and/or hardware apparatus, circuits and methods for automatic phase-shifting PWM generation are disclosed herein. The circuits can leverage the fact that they are all hardware and require a limited number of circuit elements thereby resulting in a low-complexity, low-power approach to providing automatic phase-shifted PWM signal generation.

In one embodiment, a phase-shifting pulse width modulation circuit is provided. The phase-shifting pulse width modulation circuit can be configured to output pulses based on an input pulse width modulated signal, wherein the pulses are staggered relative to one another. The phase-shifting pulse width modulation circuit can include a counter-based programmable delay subcircuit consisting of two counter-based programmable delay blocks.

In another embodiment, a phase-shifting pulse width modulation circuit is provided. The phase-shifting pulse width modulation circuit can be configured to output pulses based on an input pulse width modulated signal, wherein the pulses are staggered relative to one another for powering a plurality of light emitting diode arrays one or more time periods. The phase-shifting pulse width modulation circuit can include a counter-based programmable delay subcircuit having a fixed number of counter-based programmable delay blocks. The counter-based programmable delay subcircuit can be configured to output information for generation of the pulses. The plurality of light emitting diode arrays can be a number greater than the fixed number of counter-based programmable delay blocks.

In another embodiment, a system is provided. The system can include: a phase-shifting pulse width modulation circuit configured to output pulses based on an input pulse width modulated signal, wherein the pulses are staggered relative to one another. The phase-shifting pulse width modulation circuit can include a counter-based programmable delay subcircuit consisting of two counter-based programmable delay blocks. The system can also include a light emitting diode driver configured to drive a plurality of light emitting diode strings, wherein each of the plurality of light emitting diode strings is driven by a one of the output pulses of the input width modulated signal.

Toward the accomplishment of the foregoing and related ends, the one or more embodiments comprise the features hereinafter fully described and particularly pointed out in the claims. The following description and the annexed drawings set forth herein detail certain illustrative aspects of the one or more embodiments. These aspects are indicative, however, of but a few of the various ways in which the principles of various embodiments can be employed and the described embodiments are intended to include all such aspects and their equivalents.

DETAILED DESCRIPTION

Figure 1:
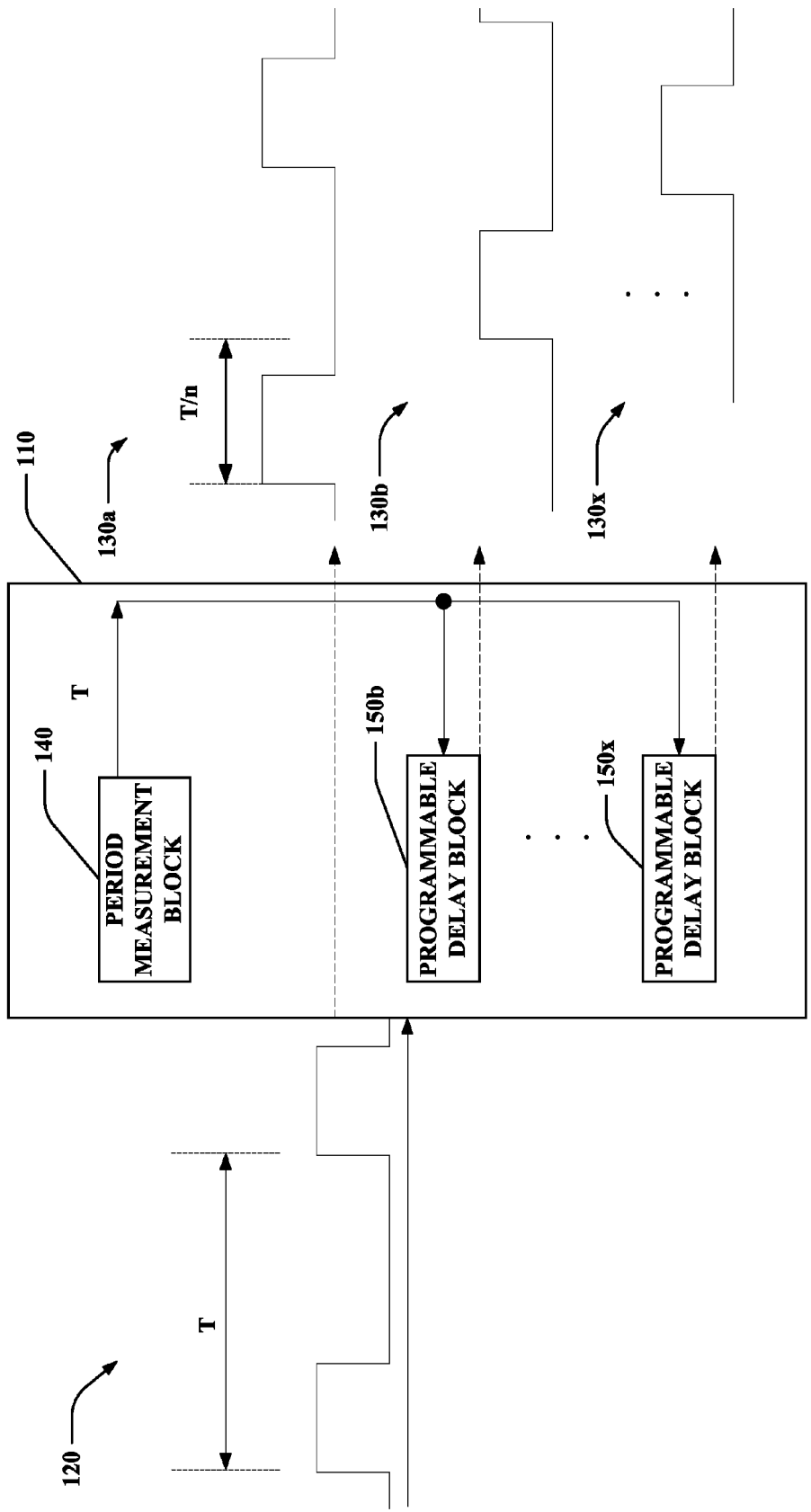
FIG. 1 is a block diagram of a conventional phase-shifting pulse width modulation signal generation circuit.

Various embodiments are now described with reference to the drawings, wherein like reference numerals are used to refer to like elements throughout. In the following description, for purposes of explanation, numerous specific details are set forth in order to provide a thorough understanding of one or more embodiments. It may be evident, however, that such embodiments may be practiced without these specific details. In other instances, well-known structures and devices are shown in block diagram form in order to facilitate describing one or more embodiments.

Figure 2:
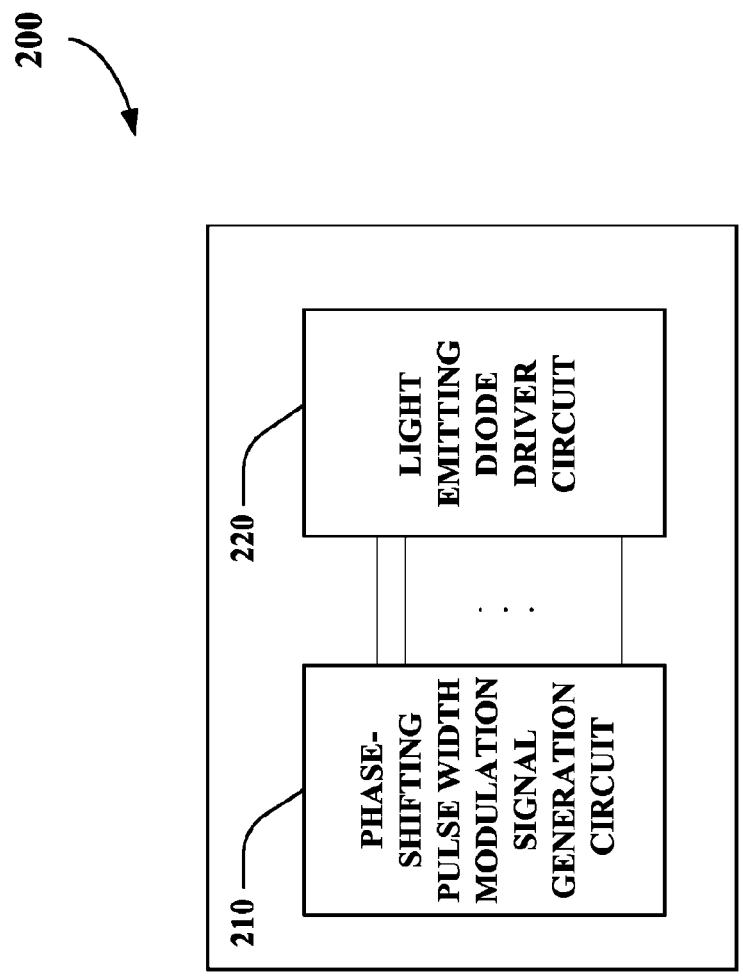
FIG. 2 is a block diagram of an apparatus in accordance with an embodiment of the present invention.

Turning to FIG. 2, FIG. 2 is a block diagram of an apparatus in accordance with an embodiment of the present invention. The apparatus 200 can include a PSPWM signal generation circuit 210 and an LED driver circuit 220. In various embodiments, the apparatus 200 can include, but is not limited to, a backlighting unit, a communication device, a device providing video or any device configured to provide lighting via illuminating LEDs and/or to power one or more LEDs.

Each output port of the PSPWM signal generation circuit 210 can be coupled to an input port of the LED driver circuit 220. The PSPWM signal generation circuit 210 can generate and output a PSPWM signal for driving the LED circuit 220. One or more of the PSPWM signal can be associated with an LED string configured to be driven by a selected LED driver. As such, the one or more PSPWM signals can be received by an LED driver and turn the associated LED string on or off. Because the pulses of the PSPWM signals can be staggered relative to one another, in some embodiments, one LED string can be turned on at any selected time. In some embodiments, the pulses can be overlapping and, in other embodiments, non-overlapping. As such, in some embodiments, more than one LED string can be turned on at any selected time. Accordingly, power consumption can be reduced relative to embodiments without the capability for turning on and off one LED string at a time.

Figure 3:
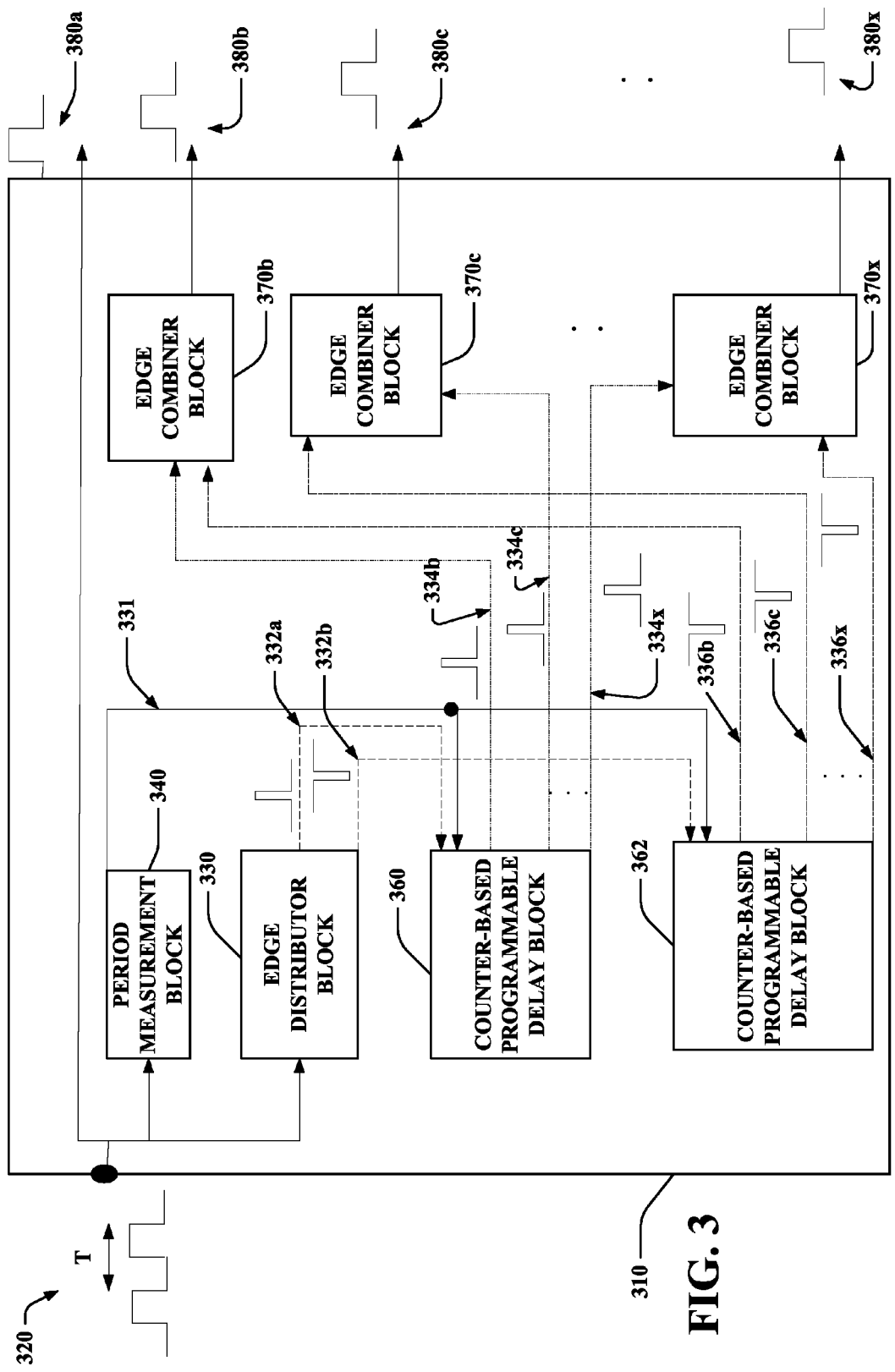
FIG. 3 is a block diagram of a phase-shifting pulse width modulation signal generation circuit in accordance with an embodiment of the present invention.

FIG. 3 is a block diagram of a phase-shifting pulse width modulation (PSPWM) signal generation circuit in accordance with an embodiment of the present invention. In some embodiments, the PSPWM signal generation circuit 310 can be or be included within the PSPWM signal generation circuit 210 of FIG. 2.

The PSPWM signal generation circuit 310 can include a period measurement block 340, an edge distributor block 330, counter-based programmable delay blocks 360, 362, and edge combiner blocks 370b, 370c, . . . , 370x. In some embodiments, edge combiner blocks 370b, 370c, . . . , 370x can be n−1 edge combiner blocks. In some embodiments, the PSPWM circuit 310 includes only two counter-based programmable delay blocks 360, 362. The two counter-based programmable delay blocks 360, 362 can be provided irrespective of the number of LED strings for which PSPWM signals are output for driving an LED driver corresponding to the LED strings. As such, the power consumption of the PSPWM signal generation circuit 310 can be less than the power consumption of circuits requiring a counter-based programmable delay block for driving each LED string, such as that described with reference to FIG. 1.

A pulse width-modulated (PWM) input signal 320 can be received at input ports to the period measurement block 340 and the edge distributor block 330. The period measurement block 340 can be configured to measure the period of the PWM input signal 320 and output information 331 indicative of the period of the PWM input signal 320. The information 331 indicative of the period can be output to and received at the counter-based programmable delay blocks 360, 362. In the embodiment shown, the PWM input signal 320 has a period, T, and the period measurement block 340 outputs information 331 indicative of the period, T.

As described above, the edge distributor block 330 can be configured to receive the PWM input signal 320. The edge distributor block 330 can be configured to detect the rising edge and the falling edge of the PWM input signal 320.

Upon detecting the rising edge or the falling edge of the PWM input signal 320, the edge distributor block 330 can output associated information. In some embodiments, the edge distributor block 330 can output information 332a indicative of the detection of a rising edge when a rising edge is detected, and can output information 332b indicative of the detection of a falling edge when a falling edge is detected.

In various embodiments, as described below with reference to FIG. 7, the information 332a indicative of a rising edge can be a value of '1' or a high value or a value higher than the value when a falling edge is detected. The information 332b indicative of a falling edge can be a value of '0' or a low value or a value lower than the value when a rising edge is detected.

As described above, the counter-based programmable delay blocks 360, 362 can be configured to receive the information 331 indicative of the period, T, from the period measurement block 340. The counter-based programmable delay blocks 360, 362 can be configured to output a plurality of staggered output signals with pulses 334b, 334c, . . . , 334x and 336b, 336c, . . . , 336x. In some embodiments, pulses 334b, 334c, . . . , 334x can be n−1 pulses. In some embodiments, pulses 336b, 336c, . . . , 336x can be n−1 pulses. The staggered output signals with pulses 334b, 334c, . . . , 334x can correspond to information indicative of the timing of the detection of a rising edge of the PWM input signal 320, while staggered output signals with pulses 336b, 336c, . . . , 336x correspond to information indicative of the timing of the detection of a falling edge of the PWM input signal 320. The pulses can be overlapping or non-overlapping in various embodiments.

As shown in FIG. 3, the staggered output signals from the counter-based programmable delay blocks 360, 362 can be delayed relative to one another such that the pulses are equally spaced from with one another. The rising edge portion 334b for a particular pulse of a PWM input signal 320 can correspond to the falling edge portion 336b for the same pulse of the PWM input signal 320.

One or more of the edge combiner blocks 370b, 370c, . . . , 370x can each be configured to receive staggered output signals with pulses 334b, 334c, . . . , 334x from counter-based programmable delay block 360 corresponding to rising edge detection and staggered output signals with pulses 336b, 336c, . . . , 336x from counter-based programmable delay block 362 corresponding to falling edge detection. The edge combiner blocks that receive the staggered output signals with pulses 334b, 334c, . . . , 334x, and pulses 336b, 336c, . . . , 336x can combine the rising edge portion and the falling edge portion of the signals and output a pulse signal. Because the outputs from the counter-based programmable delay blocks 360, 362 are staggered, the output signals 380b, 380c, . . . , 380x from the edge combiner blocks 370b, 370c, . . . , 370x can be similarly staggered.

Accordingly, the PSPWM signal generation circuit 310 can generate and automatically output staggered pulses 380b, 380c, . . . , 370x. In some embodiments, output staggered pulses 380b, 380c, . . . , 370x can be n−1 output staggered pulses. Further, the PSPWM signal generation circuit 310 can generate and output a first pulse, 380a, output from the PSPWM signal generation circuit 310. The first pulse 380a can be a pulse that is not delayed relative to the other pulses 370b, 370c, . . . , 370x.

The pulses 380a, 380b, 380c, . . . , 380x can be output to a LED driver circuit (not shown) for driving n LED strings. In some embodiments, pulses 380a, 380b, 380c, . . . , 380x can be n pulses. In some embodiments, the LED driver circuit can be the LED driver circuit 220 of FIG. 2. Each of the pulses 380a, 380b, 380c, . . . , 380x can turn on an LED string of an LED array. Accordingly, the embodiment shown in FIG. 3 can control one LED string to be powered at a selected time.

In some embodiments, the PSPWM signal generation circuit 310 can control one LED string in an array having n LED strings to be powered at a selected time while employing only two counter-based programmable delay blocks 360, 362. Further, the PSPWM signal generation circuit 310 can provide such functionality while employing an all hardware circuit such as that shown in FIG. 3. The all-hardware circuit can advantageously facilitate the processing of delay that is inherent and necessary for the functionality of the circuit 310. Because software implementations fail to be able to accurately track and facilitate the processing of delay well, PSPWM circuits that employ software components are less robust and accurate for the PSPWM application described herein.

Figure 4:
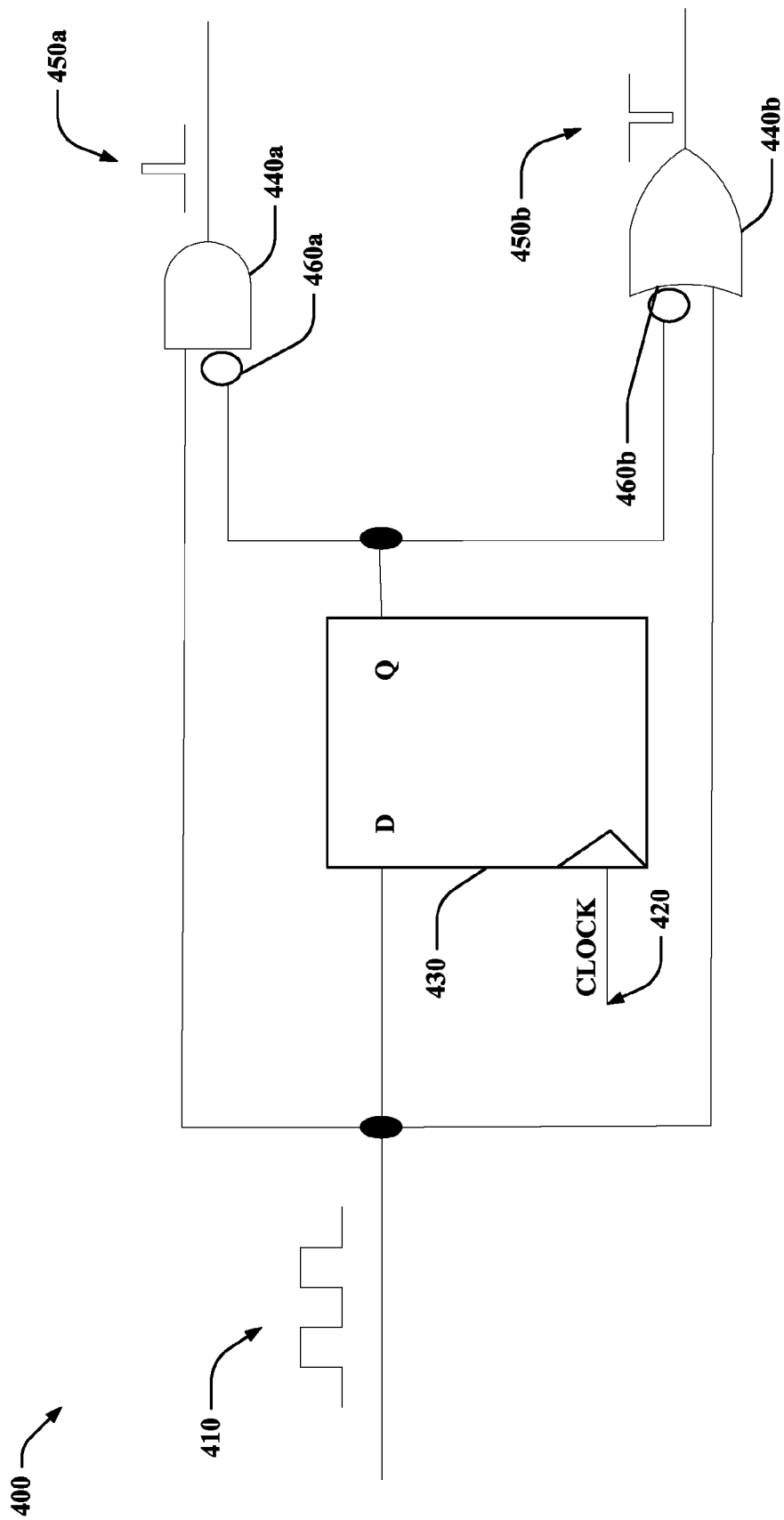
FIG. 4 is a block diagram of an edge distributor circuit in accordance with an embodiment of the present invention.

FIG. 4 is a block diagram of an edge distributor circuit in accordance with an embodiment of the present invention. The edge distributor circuit 400 can be or be included as part of the edge distributor block 330 of FIG. 3.

Referring back to FIG. 4, the edge distributor circuit 400 can include a D-type flip-flop (DFF) 430 having an input port, D, an output port, Q, and a clock port for receiving a clock signal 420. Although not shown, the DFF 430 can also include a set input, reset input and a Q-inverted output, as is well-known to those of ordinary skill in the art. The edge distributor circuit 400 can also include an AND gate 440a, an OR gate 440b and inverters 460a, 460b.

The input to the DFF 430, the AND gate 440a and the OR gate 440b can be the PWM input signal 410. In some embodiments, the PWM input signal 410 can be the PWM input signal 320 of FIG. 3. As shown in FIG. 4, the output of the DFF 430 can be inverted via inverters 460a, 460b. The inverted output from inverter 460a can be provided as an input to AND gate 440a and the inverted output from the inverter 460b can be provided as an input to OR gate 440b. The AND gate 440a can output a signal 450a indicative of a detected rising edge of the PWM input signal 410. The OR gate 440b can output a signal 450b indicative of a detected falling edge of the PWM input signal 410. The signal 450a indicative of the rising edge and the signal 450b indicative of the falling edge can be output from the AND gate 440a and the OR gate 440b, respectively, delayed relative to one another.

With reference to FIGS. 3 and 4, the edge distributor circuit 400 shown in FIG. 4 is only one example of an implementation of the edge distributor block 330 described herein. In other embodiments, the edge distributor block 330 can be composed of any hardware adapted to perform the functions of the edge distributor block 330 as described with reference to FIGS. 3, 4 and/or 7.

Figure 5:
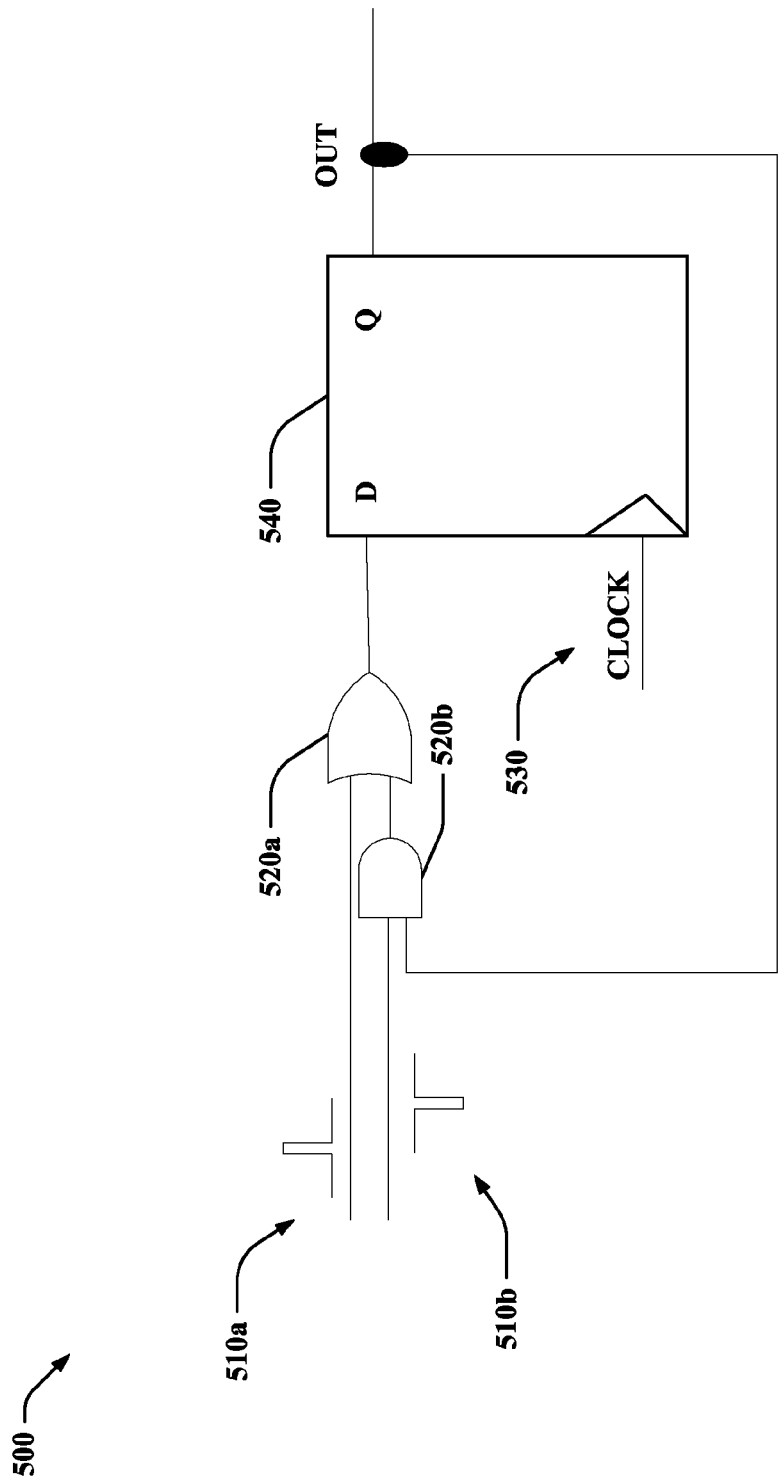
FIG. 5 is a block diagram of an edge combiner circuit in accordance with an embodiment of the present invention.

FIG. 5 is a block diagram of an edge combiner circuit in accordance with an embodiment of the present invention. The edge combiner circuit 500 can be or be included as part of any one of the edge combiner blocks 370-370n−1 of FIG. 3.

Referring back to FIG. 5, the edge combiner circuit 500 can include a D-type flip-flop 540 having an input port, D, an output port, Q, and a clock port for receiving a clock signal 530. Although not shown, the D-type flip-flop 540 can also include a set input, reset input and a Q-inverted output, as is well-known to those of ordinary skill in the art.

The edge combiner circuit 500 can also include an OR gate 520a and an AND gate 520b. The inputs to the AND gate 520b can be the Q output from the D-type flip-flop 540 and a signal 510b indicative of the falling edge detection from the counter-based programmable delay 362 of FIG. 3. The inputs to the OR gate 520a can be the output of the AND gate 520b and a signal 510a indicative of the rising edge detection from the counter-based programmable delay 360 of FIG. 3. The input to the D-type flip-flop 540 can be the output from the OR gate 520a.

With reference to FIGS. 3 and 5, the edge combiner circuit 500 shown in FIG. 5 is only one example of an implementation of the edge combiner blocks 370b, 370c, . . . , 370x described herein. In other embodiments, the edge combiner blocks 370b, 370c, . . . , 370x can be composed of any hardware adapted to perform the functions of the edge combiner blocks 370b, 370c, . . . , 370x as described with reference to FIGS. 3, 5 and/or 6A and 6B.

Figure 6A:
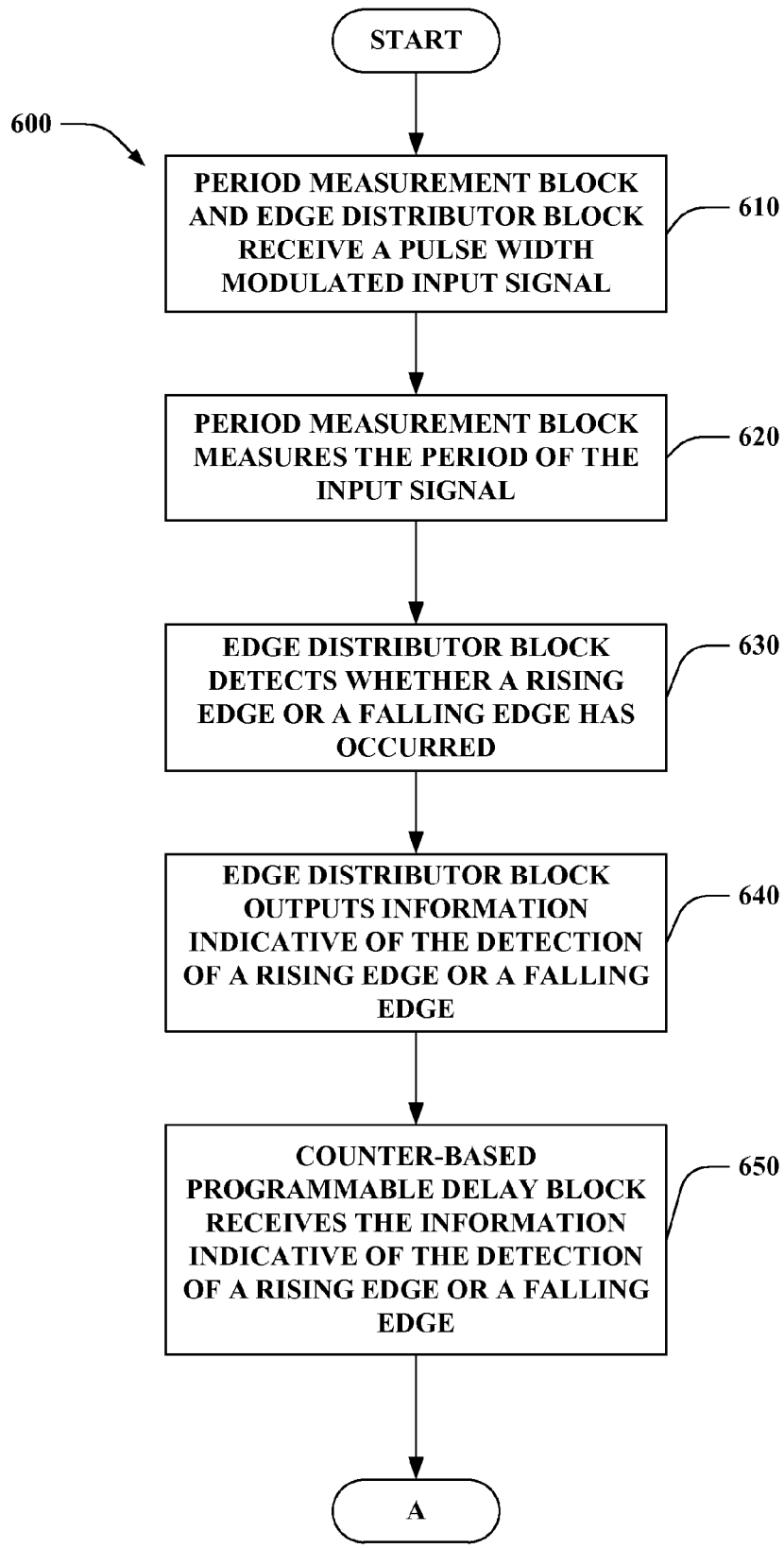
FIGS. 6A and 6B are flowcharts of a method of operation of a phase-shifting pulse width modulation signal generation circuit in accordance with an embodiment of the present invention.
Figure 6B:
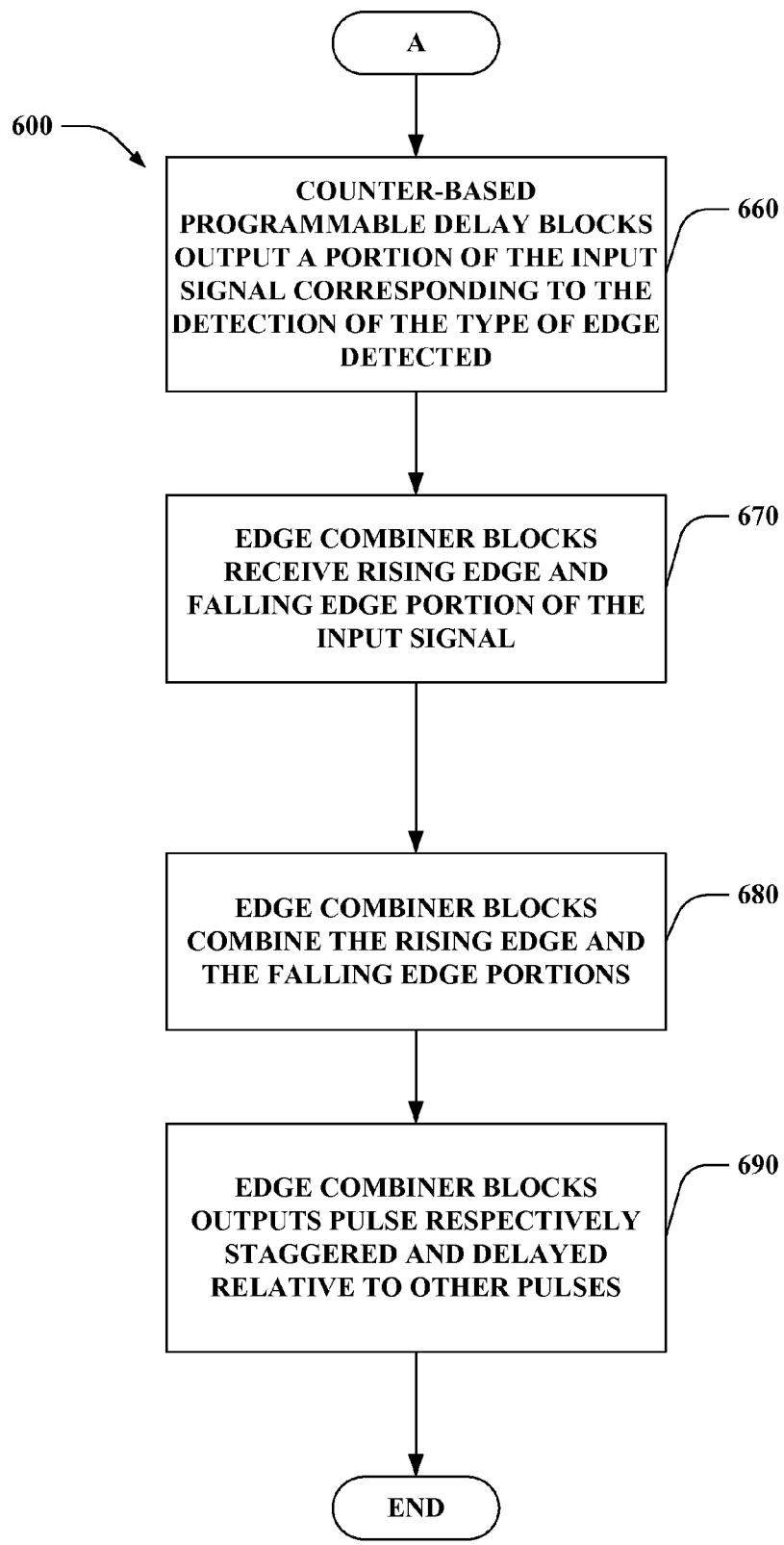

FIG. 6 is a flowchart of a method of operation of a phase-shifting pulse width modulated signal generation circuit in accordance with an embodiment of the present invention. The method 600 will be described with reference to FIGS. 3, 6A and 6B.

At 610, method 600 can include receiving a PWM input signal. The PWM input signal can be received by the period measurement block 340 and/or the edge distributor block 330 of FIG. 3.

At 620, method 600 can include measuring the period of the PWM input signal. The period measurement block 340 can measure the period of the PWM input signal.

At 630, method 600 can include detecting whether a rising edge or a falling edge of the PWM input signal has occurred. At 640, method 600 can include outputting information indicative of the detection of a rising edge or a falling edge of the PWM input signal. Detection and outputting can be performed by the edge discriminator block 330.

At 650, method 600 can include receiving the information indicative of the detection of a rising edge or a falling edge of the PWM input signal. At 660, the method 600 can include outputting a portion of the PWM input signal corresponding to the type of the edge detected at a time corresponding to the detection of the type of the edge. In embodiments, the portion of the PWM input signal can be staggered and delayed relative to other portions output. Receiving and outputting can be performed by the counter-based programmable delay blocks 360, 362.

At 670, method 600 can include receiving the rising edge and a falling edge portion of the output signals. At 680, method 600 can include combining the rising edge and the falling edge portions of the output signals. At 690, method 600 can include outputting a pulse of a PWM signal. The pulse can result from combining corresponding rising edge and falling edge portions of the signal. Receiving, combining and outputting can be performed by the edge combiner blocks 370b, 370c, . . . , 370x.

In some embodiments (not shown), method 600 can also include receiving the pulse the PWM signal at an LED driver of an LED driver circuit associated with an LED string. In some embodiments (not shown), method 600 can also include powering the LED string associated with the LED driver that received the pulse of the PWM signal.

Figure 7:
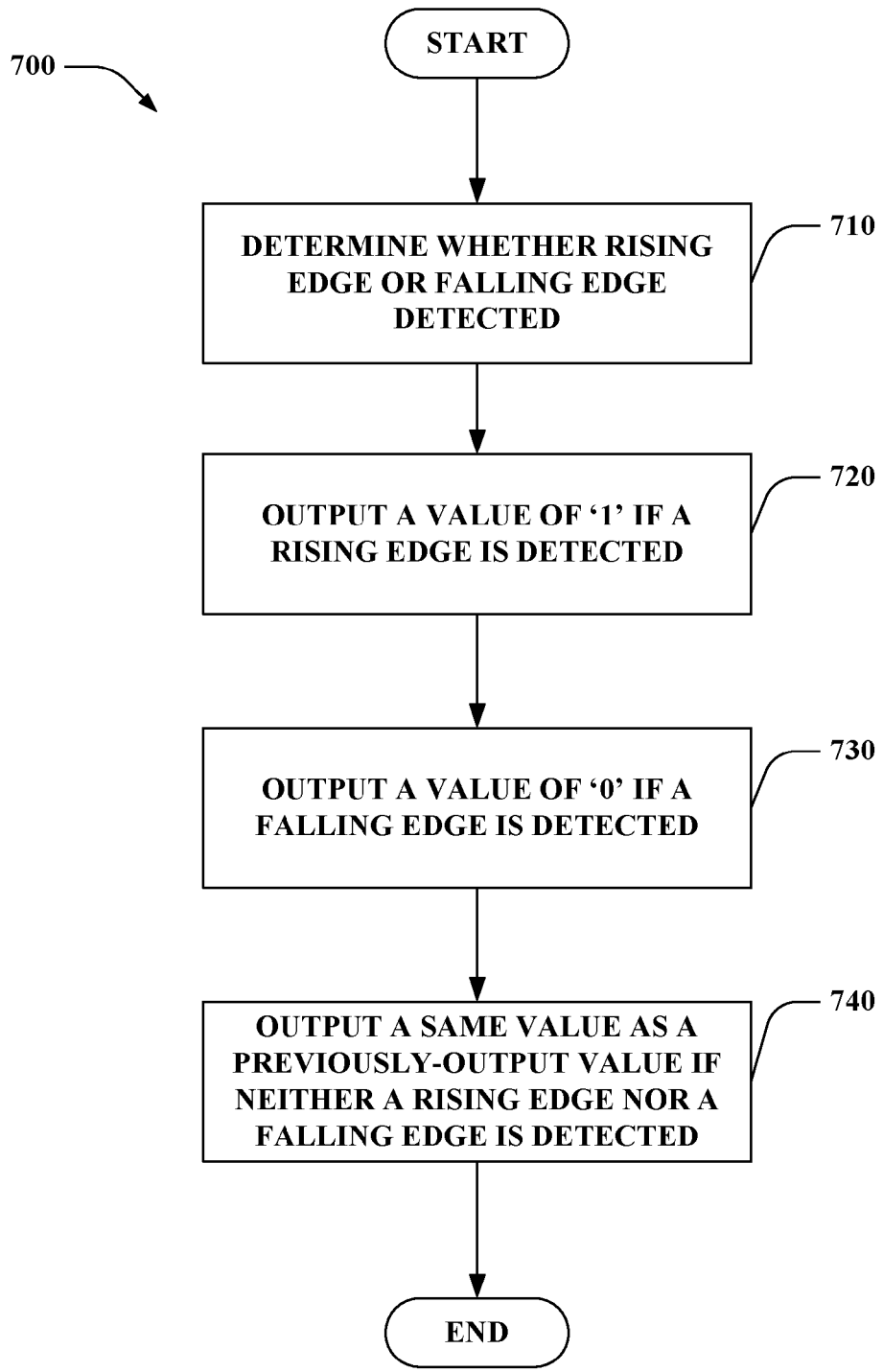
FIG. 7 is a flowchart of a method of operation of an edge distributor circuit in accordance with embodiments of the present invention.

FIG. 7 is a flowchart of a method of operation of an edge distributor circuit in accordance with an embodiment of the present invention. The method can be modeled as a finite state machine in some embodiments.

At 710, method 700 can include determining whether a rising edge or a falling edge of a PWM input signal has been detected.

At 720, the method 700 can include outputting, a signal indicative of a value of '1' (or any signal indicative of a high value or a value higher than the value output at step 730) if a rising edge is detected. At 730, the method 700 can include outputting a signal indicative of a value of '0' (or any signal indicative of a low value or a value lower than the value output at step 720) if a falling edge is detected.

At 740, the method 700 can include outputting a signal indicative of a previously-output value if neither a rising edge nor a falling edge is detected.

It is to be understood that the embodiments described herein can be implemented in hardware, software or a combination thereof. For a hardware implementation, the embodiments (or modules thereof) can be implemented within one or more application specific integrated circuits (ASICs), mixed signal circuits, digital signal processors (DSPs), digital signal processing devices (DSPDs), programmable logic devices (PLDs), field programmable gate arrays (FPGAs), processors, controllers, micro-controllers, microprocessors and/or other electronic units designed to perform the functions described herein, or a combination thereof.

When the embodiments are implemented in software, firmware, middleware or microcode, program code or code segments, they can be stored in a machine-readable medium (or a computer-readable medium), such as a storage component. A code segment can represent a procedure, a function, a subprogram, a program, a routine, a subroutine, a module, a software package, a class, or any combination of instructions, data structures, or program statements. A code segment can be coupled to another code segment or a hardware circuit by passing and/or receiving information, data, arguments, parameters, or memory contents.

What has been described above includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A phase-shifting pulse width modulation circuit configured to output pulses based on an input pulse width modulated signal, wherein the pulses are staggered relative to one another, the phase-shifting pulse width modulation circuit comprising a counter-based programmable delay subcircuit consisting of two counter-based programmable delay blocks.

2. The phase-shifting pulse width modulation circuit of claim 1, wherein the phase-shifting pulse width modulation circuit is implemented in hardware.

3. The phase-shifting pulse width modulation circuit of claim 1, wherein the pulses are non-overlapping.

4. A phase-shifting pulse width modulation circuit configured to output pulses based on an input pulse width modulated signal, wherein the pulses are staggered relative to one another for powering a plurality of light emitting diode arrays during one or more time periods, the phase-shifting pulse width modulation circuit comprising a counter-based programmable delay subcircuit having a fixed number of counter-based programmable delay blocks, the counter-based programmable delay subcircuit configured to output information for generation of the pulses, and the plurality of light emitting diode arrays is a number greater than the fixed number of counter-based programmable delay blocks.

5. The phase-shifting pulse width modulation circuit of claim 4, wherein the fixed number of counter-based programmable delay blocks is two.

6. The phase-shifting pulse width modulation circuit of claim 4, wherein the pulses are non-overlapping.

7. The phase-shifting pulse width modulation circuit of claim 4, further comprising:
a period measurement block configured to measure a period of an input signal to the phase-shifting pulse width modulation circuit;
an edge distributor block configured to:
receive the input signal; and
output information indicative of a detection of a rising edge of the input signal and information indicative of a detection of a falling edge of the input signal, wherein the counter-based programmable delay subcircuit is configured to receive the information indicative of the detection of the rising edge and the information indicative of the detection of the falling edge and generate the information for generation of the pulses.

8. The phase-shifting pulse width modulation circuit of claim 7, wherein the edge distributor block comprises a D-type flip flop, an AND gate, a first inverter, a second inverter and an OR gate, wherein a D-input port of the D-type flip-flop is coupled to an input port to the edge distributor block, and wherein a Q-output port of the D-type flip-flop is coupled to inputs of the first inverter and the second inventor, and wherein a first input port of the AND gate is coupled to the input port to the edge distributor block, and a second input port of the AND gate is coupled to an output of the first inverter and wherein a first input port of the OR gate is coupled to the input port to the edge distributor block, and a second input port of the OR gate is coupled to an output of the second inverter.

9. The phase-shifting pulse width modulation circuit of claim 7, wherein the output information indicative of a detection of a rising edge of the input signal is a first value and the information indicative of a detection of a falling edge of the input signal is a second value.

10. The phase-shifting pulse width modulation circuit of claim 9, wherein the first value is at least one of: a '1' or a value indicative of a high value or a value indicative of a value that is greater than the second value.

11. The phase-shifting pulse width modulation circuit of claim 9, wherein the second value is at least one of: a '0' or a value indicative of a low value or a value indicative of a value that is less than the first value.

12. The phase-shifting pulse width modulation circuit of claim 7, further comprising:
an edge combiner subcircuit configured to receive the information for generation of the pulses and output the pulses.

13. The phase-shifting pulse width modulation circuit of claim 12, wherein the edge combiner subcircuit comprises a plurality of blocks for respectively outputting the pulses, wherein at least one of the plurality of blocks comprises a D-type flip-flop, an OR gate and an AND gate,
wherein a first input port of the AND gate is coupled to a first input port of the edge combiner subcircuit and a second input port of the AND gate is coupled to a Q-output port of the D-type flip-flop,
and wherein a first input port of the OR gate is coupled to an output port of the AND gate and a second input port of the OR gate is coupled to a second input port of the edge combiner subcircuit,
and wherein a D-input port of the D-type flip-flop is coupled to an output port of the OR gate.

14. A system, comprising:
a phase-shifting pulse width modulation circuit configured to output pulses based on an input pulse width modulated signal, wherein the pulses are staggered relative to one another, the phase-shifting pulse width modulation circuit comprising a counter-based programmable delay subcircuit consisting of two counter-based programmable delay blocks; and
a light emitting diode driver configured to drive a plurality of light emitting diode strings, wherein each of the plurality of light emitting diode strings is driven by a one of the output pulses of the input width modulated signal.

15. The system of claim 14, wherein the phase-shifting pulse width modulation circuit further comprises:
a period measurement block configured to measure a period of an input signal to the phase-shifting pulse width modulation circuit;
an edge distributor block configured to:
receive the input signal; and
output information indicative of a detection of a rising edge of the input signal and information indicative of a detection of a falling edge of the input signal, wherein the counter-based programmable delay subcircuit is configured to receive the information indicative of the detection of the rising edge and the information indicative of the detection of the falling edge and generate information for generation of the pulses.

16. The system of claim 15, wherein the output information indicative of the detection of a rising edge of the input signal is a first value and the information indicative of the detection of a falling edge of the input signal is a second value.

17. The system of claim 16, wherein the first value is at least one of: a '1' or a value indicative of a high value or a value indicative of a value that is greater than the second value.

18. The system of claim 16, wherein the second value is at least one of: a '0' or a value indicative of a low value or a value indicative of a value that is less than the first value.

19. The system of claim 14, wherein the phase-shifting pulse width modulation circuit is implemented in hardware.

20. The system of claim 14, wherein the pulses are non-overlapping.

* * * * *

UNITED STATES PATENT AND TRADEMARK OFFICE
CERTIFICATE OF CORRECTION

PATENT NO. : 8,339,174 B2
APPLICATION NO. : 12/712930
DATED : December 25, 2012
INVENTOR(S) : Zhiyu Yang et al.

It is certified that error appears in the above-identified patent and that said Letters Patent is hereby corrected as shown below:

In the Claims:

Column 8, Line 66, Claim 8, delete "flip flop," and insert -- flip-flop, --, therefor.

Column 9, Line 4, Claim 8, delete "inventor," and insert -- inverter, --, therefor.

Signed and Sealed this
Thirtieth Day of April, 2013

Teresa Stanek Rea
*Acting Director of the United States Patent and Trademark Office*